US006765302B2

United States Patent
Muff et al.

(10) Patent No.: US 6,765,302 B2
(45) Date of Patent: Jul. 20, 2004

(54) SEMICONDUCTOR MODULE HAVING A CONFIGURABLE DATA WIDTH OF AN OUTPUT BUS, AND A HOUSING CONFIGURATION HAVING A SEMICONDUCTOR MODULE

(75) Inventors: Simon Muff, Höhenkirchen (DE); Martin Gall, München (DE); Oliver Kiehl, Charlotte, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/266,322

(22) Filed: Oct. 8, 2002

(65) Prior Publication Data

US 2003/0067063 A1 Apr. 10, 2003

(30) Foreign Application Priority Data

Oct. 8, 2001  (DE) .......................................... 101 49 590

(51) Int. Cl.[7] .............................................. H01L 23/48
(52) U.S. Cl. ........................ 257/786; 257/691; 257/678
(58) Field of Search ................................ 257/786, 691, 257/678

(56) References Cited

U.S. PATENT DOCUMENTS

| 3,909,837 | A | * | 9/1975 | Kronlage ..................... 257/486 |
| 4,353,040 | A |   | 10/1982 | Krumm et al. |
| 4,884,237 | A |   | 11/1989 | Mueller et al. |
| 4,979,016 | A | * | 12/1990 | Lee .............................. 247/668 |
| 5,982,655 | A |   | 11/1999 | Doyle |
| 6,426,560 | B1 | * | 7/2002 | Kawamura et al. .......... 257/786 |
| 6,569,727 | B1 | * | 5/2003 | Casper et al. ................ 438/210 |
| 2002/0110939 | A1 | * | 8/2002 | Miki et al. ..................... 257/48 |

FOREIGN PATENT DOCUMENTS

EP             0893781 A1  *  1/1999

* cited by examiner

*Primary Examiner*—Jasmine Clark
(74) *Attorney, Agent, or Firm*—Laurence A. Greenberg; Werner H. Stemer; Gregory L. Mayback

(57) ABSTRACT

A semiconductor module having a configurable data width of an output bus has data connecting pads as well as driver circuits having a respective output that is connected to an associated data connecting pad. At least one of the data connecting pads, which is not used for interchanging data or commands during operation, is permanently connected to a connection for an internal supply voltage. Thus, in a module configuration with a reduced number of data lines being used, the remaining data lines can be operated at an increased frequency, since the signal-to-ground ratio is improved.

12 Claims, 2 Drawing Sheets

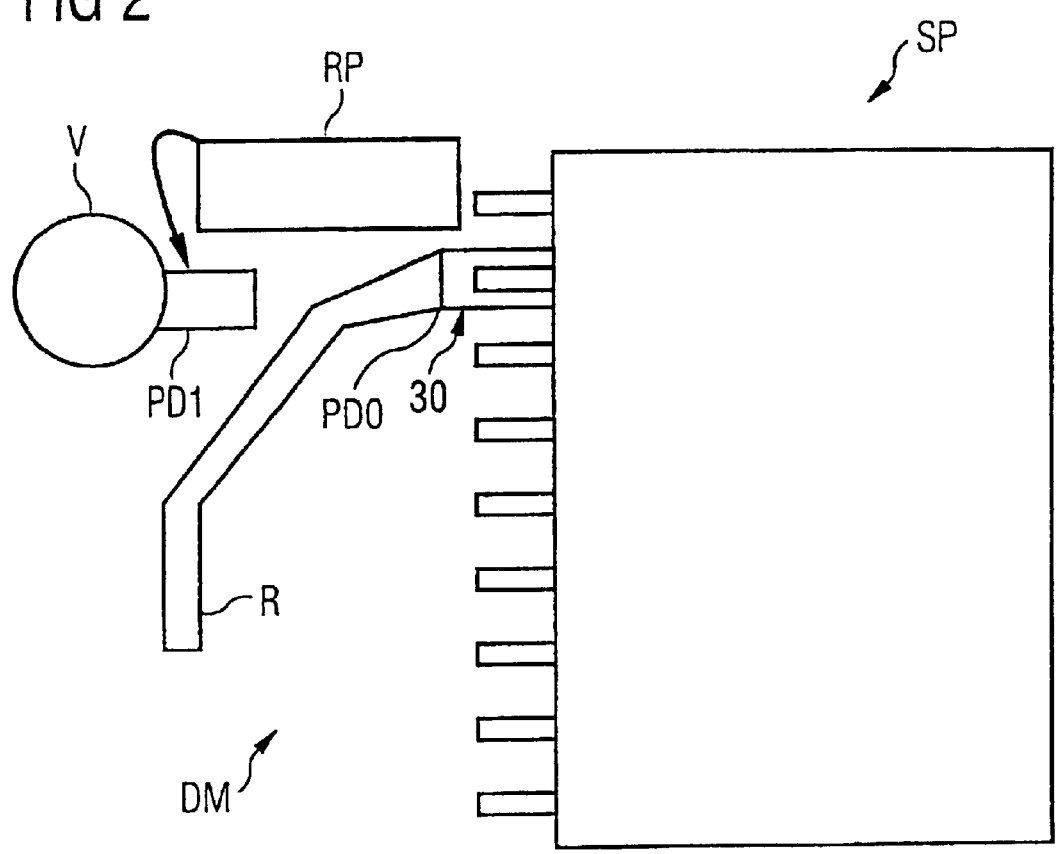

SEMICONDUCTOR MODULE HAVING A CONFIGURABLE DATA WIDTH OF AN OUTPUT BUS, AND A HOUSING CONFIGURATION HAVING A SEMICONDUCTOR MODULE

BACKGROUND OF THE INVENTION

Field of the Invention

The present invention relates to a semiconductor module having a configurable data width of an output bus, and to a housing configuration having such a semiconductor module.

Semiconductor modules such as semiconductor memory chips are used in various module configurations. The module configurations differ in particular in the number of data lines which are used and are connected to data connecting pads, so-called I/O pads, in order to achieve a system bus width of 64 or 72 bits. The data connecting pads are used for interchanging data between the module and a system controller. So-called x4, x8 and x16 module configurations exist, which use 4, 8 or 16 data lines per module for interchanging data.

For integration in a data processing system, semiconductor modules such as semiconductor memory chips are, for example, placed on a memory board (for example a so-called DIMM board) after being fitted into a housing (so-called package).

Currently used memory housings such as thin small outline package (TSOP) generally have a limited number of connecting pins, for example 54 or 66. The number of connecting pins is sufficient for present-day memory systems with a specified data and address bus topology, in order to connect 4, 8 or 16 bidirectional data lines with associated command and address lines.

If, by virtue of its basic configuration, a semiconductor module can be used in all x4, x8 and x16 module configurations and accordingly can be configured in the data width of at least one output bus, this results in that, if an x4 or x8 module configuration is provided, there are correspondingly unused connecting pins, so-called no-connects (NC), which are not electrically connected within the module. In general, all the connecting pins are used in an x16 module configuration. In this case, the achievable ratio of data connecting pads to connecting pads for connection of a ground potential (so-called signal-to-ground ratio) is normally 2:1. Therefore, two data connecting pads are associated with a common connecting pad for the positive supply voltage, and one connecting pad for a reference voltage (ground potential).

The effective overall inductance of a signal path is essentially governed by the series circuit formed by the inductance of the signal pin (that is to say the path from the driver via the pad, the bonding wire and the leadframe) and the effective inductance in the supply lines (that is to say the path from the supply connection of the driver to the supply pad, bonding wire and leadframe). If, for example, one driver is connected to two ground pins, the so-called return path inductance is approximately half as great as if it were connected via a single pin. If the ground connection is physically very close to the signal, the coupling inductance (so-called mutual inductance) is further reduced, or compensated for.

If, for example, one of the data connecting pads in an x4 or x8 module configuration is a no-connect, because that connecting pad is not used for interchanging data or commands, although this results in an improved signal-to-ground ratio, the achievable return path inductance is, however, restricted. In consequence, the maximum possible data transmission rate at which the data lines that are used can be operated is restricted.

The use of other mounting technologies (for example so-called chip scale or size packages (CSP) in ball grid arrays) makes it possible to use housing forms with an increased number of ground connecting pins while at the same time occupying less space on the board. In consequence, this can have a positive influence on the signal-to-ground ratio, hence reducing the inductance. Furthermore, housing forms such as these have less intrinsic inductance since their geometry is smaller and due to the use of appropriate materials. However, these housing forms are in general comparatively expensive to produce.

SUMMARY OF THE INVENTION

It is accordingly an object of the invention to provide a semiconductor module having a configurable data width of an output bus, and a housing configuration having a semiconductor module which overcomes the above-mentioned disadvantages of the prior art devices of this general type, in which data lines which are connected to data connecting pads can also be operated at a comparatively high frequency in a module configuration in which a reduced number of data lines are used.

With the foregoing and other objects in view there is provided, in accordance with the invention, a semiconductor module having a configurable data width of at least one output bus. The semiconductor module contains data connecting pads, driver circuits each having an output connected to an associated one of the data connecting pads, and a connection for receiving an internal supply voltage for the semiconductor module. At least one of the data connecting pads not being used for interchanging data or commands during operation of the semiconductor module is permanently connected to the connection.

The semiconductor module according to the invention has data connecting pads and a connection for an internal supply voltage as well as driver circuits. Each of the driver circuits has an associated data connecting pad and a respective output which is connected to the associated data connecting pad. The semiconductor module which, for example, is in the form of a memory chip is, for example, contained in an x16 housing configuration and is usable in an x4 or x8 module configuration, in which the other pads (I/Os 9 to 16) are not connected to the housing. The x4 and x8 module configurations are used in particular in so-called high-end systems.

According to the invention, one of the data connecting pads, which is not used for interchanging data or commands during operation of the semiconductor module, is permanently connected to the connection for the internal supply voltage for the semiconductor module. It is thus possible, using previous housing forms, to achieve a reduced inductance in the current path of the data lines when only one x4 and x8 module configuration is used. This makes it possible to use a higher clock frequency on the data lines, and hence to achieve an increased data rate.

One input of one of the driver circuits, whose output is connected to one of the data connecting pads, is advantageously permanently connected to a further connection for a supply voltage for the semiconductor module.

In one embodiment of the semiconductor module according to the invention, one of the data connecting pads and/or the input of the driver circuit which is connected to that data connecting pad are/is connected to the respective connection via a closed switch in the form of a so-called on-chip metal option. These metal options form simple switches.

Since, in principle, the invention can be used independently of the mounting technology that is used, it is also possible, provided there are a sufficient number of connecting pins, to implement logic switches via which one of the connecting pads and/or the input of the driver circuit which is connected to that connecting pad are/is connected to the respective connection. A logic switch such as this advantageously has an external connection, via which the logic switch can be controlled. The external connection is, for example, connected to the exterior as an additional connecting pin, thus allowing external control of the circuitry of an unused data connecting pad for the additional power supply.

In accordance with an added feature of the invention, an additional connection for receiving an externally supplied supply voltage is provided, and one of the data connecting pads is permanently connected to the additional connection. The additional connection for the externally supplied supply voltage is a ground connection.

In accordance with a further feature of the invention, a switching transistor is provided that is permanently switched on. The output of one of the driver circuits is connected to the connection for the internal supply voltage through the switching transistor.

With the foregoing and other objects in view there is provided, in accordance with the invention, a housing configuration. The housing configuration includes a semiconductor module containing data connecting pads, driver circuits each having an output connected to an associated one of the data connecting pads, and a connection for receiving an internal supply voltage for the semiconductor module. At least one of the data connecting pads not being used for interchanging data or commands during operation of the semiconductor module is permanently connected to the connection. A mounting substrate is provided and the semiconductor module is disposed on the mounting substrate. The mounting substrate has a contact hole for making contact with an externally supplied supply voltage. A resistor link is provided and connecting pins extend from the semiconductor module. One of the connecting pins is connected to the data connecting pad not being used for interchanging data or commands during operation of the semiconductor module. The connecting pin and the contact hole are fitted with the resistor link. The resistor link short-circuits the data connecting pad and the contact hole.

Other features which are considered as characteristic for the invention are set forth in the appended claims.

Although the invention is illustrated and described herein as embodied in a semiconductor module having a configurable data width of an output bus, and a housing configuration having a semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is an illustration of one embodiment of a housing configuration having the semiconductor memory chip disposed on a mounting substrate (DIMM).

DESCRIPTION OF THE PREFERRED EMBODIMENTS

Figure 1:
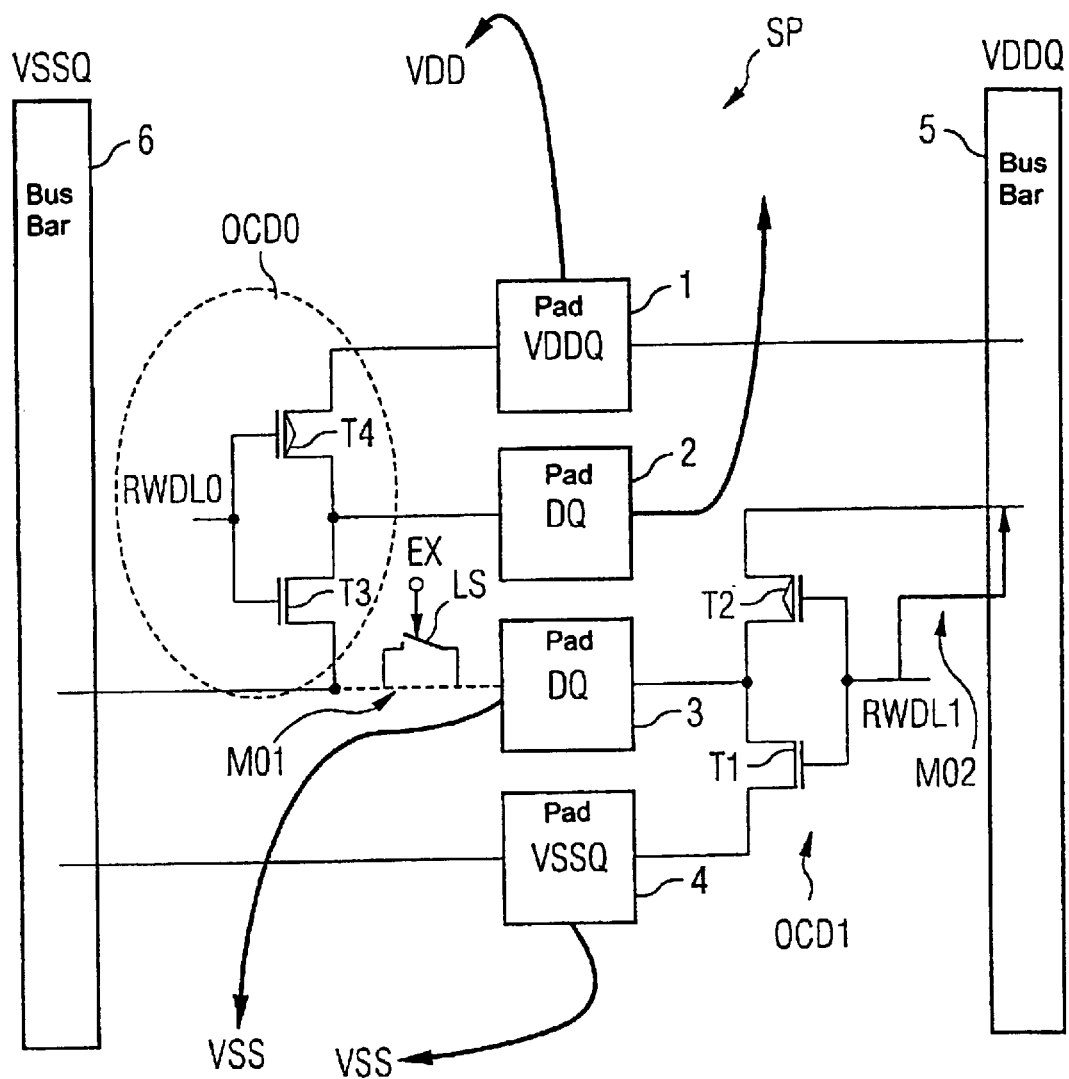
FIG. 1 is a block circuit diagram of one embodiment of a semiconductor memory chip having data connecting pads and connections for internal supply voltages.

Referring now to the figures of the drawing in detail and first, particularly, to FIG. 1 thereof, there is shown diagrammatically, a semiconductor memory chip SP which has connecting pads 1 to 4. The connecting pad 1 is connected to a busbar 5 for an internal supply voltage VDDQ, which is a positive operating voltage for the chip SP. The connecting pad 4 is connected to a busbar 6 for the internal supply voltage VSSQ, which is a reference voltage for the chip SP. The connecting pad 1 is furthermore connected externally by a connecting wire to the operating voltage pin VDD on a housing, as indicated in FIG. 1 by a bold arrow. In a corresponding way, the connecting pad 4 is externally connected to a connection for the supply voltage VSS. The supply voltage VSS represents a ground potential.

The connecting pads 2 and 3 are used for transmitting data signals DQ. The memory chip SP, only part of which is illustrated in FIG. 1, also has driver circuits OCD0 and OCD1, which are respectively associated with one of the data connecting pads 2 or 3. A respective output of the driver circuits OCD0 and OCD1 is connected to the respectively associated data connecting pad 2 or 3. One input of the driver circuit OCD0 is connected to the data line RWDL0. One input of the driver circuit OCD1 is connected to the data line RWDL1.

The rest of the wiring is based on the known principle of a push-pull driver. The output of the driver circuit OCD1 is connected via the switching transistor T1 to the connecting pad 4 for the internal supply voltage VSSQ. The output of the driver circuit OCD1 is also connected through the switching transistor T2 to the busbar 5 for the internal supply voltage VDDQ. In a corresponding way, the output of the driver circuit OCD0 is connected through the switching transistor T3 to the busbar 6 for the internal supply voltage VSSQ. The output of the driver circuit OCD0 is also connected through the switching transistor T4 to the connecting pad 1.

By virtue of its basic construction, the illustrated semiconductor memory chip is configured, for example, for an x4, x8 and x16 module configuration, and accordingly has 16 data connecting pads, only two of which are shown, for reasons of clarity. It is operated in a so-called high-end system, in which, in general, x4 and x8 module configurations are used. In consequence, there are data connecting pads that are not used for interchanging data or commands during operation of the semiconductor memory chip SP. In the present example as shown in FIG. 1, one such unused data connecting pad is the connecting pad 3. According to the invention, this is permanently connected via a metal option switch MO1, which forms a simple switch, to the busbar 6 for the internal supply voltage VSSQ. The input of the driver circuit OCD1 which is connected to the data line RWDL1 (which is not used during operation of the memory chip) is furthermore permanently connected via a metal option switch MO2 to the busbar 5 for the internal supply voltage VDDQ. The connections shown in FIG. 1 by the metal option switches MO1, MO2 are produced, for example by bonding, during the packaging process.

In this case, it is possible for one or both connections to be formed, instead of this, by logic switches that can be controlled externally via a control connection. By way of example, FIG. 1 shows a logic switch LS for connecting the connecting pad 3 to the busbar 6 that, illustrated schematically, can be controlled via an external connection EX. The connection EX may be connected as an additional connecting pin externally to the memory chip, thus allowing external control of the circuitry of the data connecting pad 3 via a control signal.

The circuitry of the driver OCD1 as shown in FIG. 1 results in that the transistor T1 is permanently switched on. In consequence, the pad 3 is drawn to the ground potential GND. Furthermore, the data connecting pad 3 is permanently connected to a connection for the externally supplied supply voltage VSS. In consequence, the so-called return path inductance at the data connecting pad 2 can be reduced further, since there is a second, parallel, current return path.

The invention makes it possible, using previous housing forms, to achieve a reduced inductance, and hence a higher possible clock frequency for the data line RWDL0 as shown in FIG. 1. This allows an increased memory bus data rate to be achieved.

FIG. 2 shows one embodiment of a housing configuration having the semiconductor memory chip SP shown in FIG. 1. The memory chip SP is disposed on a mounting substrate DM, for example on a DIMM module. The mounting substrate DM has a contact hole V (so-called via) for making contact with an externally supplied supply voltage, in the example the ground potential. The memory chip SP has a number of connecting pins, with the illustrated connecting pin 30 being connected to the data connecting pad 3 as shown in FIG. 1. The connecting pin 30 makes contact with a pad PD0. The pad PD0 is in contact with a so-called routing R (conductor track) on the mounting substrate DM.

In order to connect the connecting pin 30 through the via V to the connection for the ground potential, the connecting pin 30 and the via V are fitted with a resistance link RP (so-called R pack) which thus short-circuits the data connecting pad 3 and the via V. This bridges the routing R. The contact between the R pack RP and the via V is produced via the pad PD1. The housing configuration of the memory chip SP is thus suitable for a number of module configurations and can be matched to the respectively predetermined module configuration via the fit of R packs (resistance 0 Ohm).

We claim:

1. A semiconductor module having a configurable data width of at least one output bus, comprising:
   data connecting pads;
   driver circuits each having an output connected to an associated one of said data connecting pads; and
   a connection for receiving an internal supply voltage for the semiconductor module, at least one of said data connecting pads being permanently connected to said connection, said one of said data connecting pads not being used for interchanging data or commands during operation of the semiconductor module.

2. The semiconductor module according to claim 1, further comprising a further connection for receiving a further supply voltage for the semiconductor module; and
   wherein said driver circuits have inputs and one of said inputs of one of said driver circuits is permanently connected to said further connection.

3. The semiconductor module according to claim 2, further comprising a switch in a form of a metal option, one of said data connecting pads is connected to said connection through said switch in a closed state.

4. The semiconductor module according to claim 1, further comprising a logic switch having an external connection for receiving a control signal for controlling said logic switch, one of said data connecting pads is connected to said connection through said logic switch.

5. The semiconductor module according to claim 1, further comprising an additional connection for receiving an externally supplied supply voltage, and one of said data connecting pads is permanently connected to said additional connection.

6. The semiconductor module according to claim 5, wherein said additional connection for the externally supplied supply voltage is a ground connection.

7. The semiconductor module according to claim 1, further comprising a switching transistor being permanently switched on, said output of one of said driver circuits is connected to said connection for the internal supply voltage through said switching transistor.

8. The semiconductor module according to claim 2, further comprising a switch in a form of a metal option, said one of said inputs of one of said driver circuits is connected to said further connection through said switch in a closed state.

9. The semiconductor module according to claim 2, further comprising a first switch and a second switch both in a form of a metal option, one of said data connecting pads is connected to said connection through said first switch in a closed state, and said one of said inputs of one of said driver circuits is connected to said further connection through said second switch in a closed state.

10. The semiconductor module according to claim 2, further comprising a logic switch having an external connection for receiving a control signal for controlling said logic switch, said on of said inputs of one of said driver circuits is connected to said further connection through said logic switch.

11. The semiconductor module according to claim 2, further comprising a first logic switch and a second logic switch each having an external connection for receiving a control signal, one of said data connecting pads connected to said connection through said first logic switch, and said one of said inputs of one of said driver circuits connected to said further connection through said second logic switch.

12. A housing configuration, comprising:
    a semiconductor module containing:
      data connecting pads;
      driver circuits each having an output connected to an associated one of said data connecting pads; and
      a connection for receiving an internal supply voltage for the semiconductor module, at least one of said data connecting pads being permanently connected to said connection, said one of said data connecting pads not being used for interchanging data or commands during operation of the semiconductor module;
    a mounting substrate, said semiconductor module disposed on said mounting substrate, said mounting substrate having a contact hole formed therein for making contact with an externally supplied supply voltage;
    a resistor link; and
    connecting pins extending from said semiconductor module, one of said connecting pins connected to said one of said data connecting pads not being used for interchanging data or commands during operation of the semiconductor module, said one of said connecting pins and said contact hole being fitted with said resistor link, said resistor link short-circuiting said one of said data connecting pads and said contact hole.

* * * * *